United States Patent
Wu et al.

(10) Patent No.: US 12,009,024 B2
(45) Date of Patent: Jun. 11, 2024

(54) CIRCUIT FOR READING OUT DATA, METHOD FOR READING OUT DATA AND MEMORY

(71) Applicant: CHANGXIN MEMORY TECHNOLOGIES, INC., Hefei (CN)

(72) Inventors: Xianjun Wu, Hefei (CN); Weibing Shang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 152 days.

(21) Appl. No.: 17/810,596

(22) Filed: Jul. 2, 2022

(65) Prior Publication Data

US 2023/0282268 A1 Sep. 7, 2023

Related U.S. Application Data

(63) Continuation of application No. PCT/CN2022/088719, filed on Apr. 24, 2022.

(30) Foreign Application Priority Data

Mar. 3, 2022 (CN) .......................... 202210203723.6

(51) Int. Cl.
*G11C 11/4076* (2006.01)
*G11C 11/408* (2006.01)
*G11C 11/4096* (2006.01)

(52) U.S. Cl.
CPC ...... *G11C 11/4076* (2013.01); *G11C 11/4085* (2013.01); *G11C 11/4096* (2013.01)

(58) Field of Classification Search
CPC .......................... G11C 11/4076; G11C 11/407

USPC ...................................................... 365/233.1
See application file for complete search history.

(56) References Cited

U.S. PATENT DOCUMENTS

| | | | |
|---|---|---|---|
| 9,697,885 | B1 | 7/2017 | Kim |
| 2003/0026149 | A1 | 2/2003 | Braceras |
| 2003/0151966 | A1 | 8/2003 | Demone |
| 2004/0202036 | A1 | 10/2004 | Demone |
| 2005/0180246 | A1 | 8/2005 | Demone |
| 2006/0146641 | A1 | 7/2006 | Demone |
| 2007/0070715 | A1 | 3/2007 | Kim |
| 2009/0034347 | A1 | 2/2009 | Demone |

(Continued)

FOREIGN PATENT DOCUMENTS

| | | |
|---|---|---|
| CN | 1959838 A | 5/2007 |
| CN | 101038785 A | 9/2007 |

(Continued)

*Primary Examiner* — Muna A Techane
(74) *Attorney, Agent, or Firm* — Syncoda LLC; Feng Ma

(57) ABSTRACT

A circuit includes a delay generation circuit. The delay generation circuit is configured to generate a sub-grab signal for each of the storage areas based on an initial grab signal and data transmission delay of each of the storage areas, and generate a grab enable signal based on all the sub-grab signals. A time interval between a time when the read-write control circuit receives data transmitted from each of the storage areas by a global data line and a time when the read-write control circuit receives the sub-grab signal corresponding to the storage area satisfies a preset range. The read-write control circuit is configured to read out data of the global data line to a data bus based on the grab enable signal. Therefore, the tCCD of the DRAM is optimized.

20 Claims, 8 Drawing Sheets

(56) References Cited

U.S. PATENT DOCUMENTS

| | | |
|---|---|---|
| 2009/0063803 A1 | 3/2009 | Kim |
| 2010/0232237 A1* | 9/2010 | Demone ............. G11C 11/4097 |
| | | 365/189.15 |
| 2012/0008426 A1 | 1/2012 | Demone |
| 2014/0119099 A1* | 5/2014 | Clark .................... H10B 12/50 |
| | | 365/149 |
| 2018/0088864 A1 | 3/2018 | Ikarashi |
| 2020/0371869 A1 | 11/2020 | Park et al. |
| 2021/0407576 A1 | 12/2021 | Shang et al. |
| 2022/0122680 A1 | 4/2022 | Li |
| 2022/0164297 A1* | 5/2022 | Sity .................... G06F 12/0802 |

FOREIGN PATENT DOCUMENTS

| | | |
|---|---|---|
| CN | 103247334 A | 8/2013 |
| CN | 107492392 A | 12/2017 |
| CN | 109841240 A | 6/2019 |
| CN | 111986727 A | 11/2020 |
| CN | 112582013 A | 3/2021 |
| CN | 109644020 B | 7/2021 |
| CN | 113470711 A | 10/2021 |
| CN | 113689899 A | 11/2021 |
| IN | 102760487 A | 10/2012 |
| TW | 201933107 A | 8/2019 |
| WO | 2021164032 A1 | 8/2021 |

* cited by examiner

CIRCUIT FOR READING OUT DATA, METHOD FOR READING OUT DATA AND MEMORY

CROSS-REFERENCE TO RELATED APPLICATIONS

The present disclosure is a continuation of International Application No. PCT/CN2022/088719 filed on Apr. 24, 2022, which claims priority to Chinese Patent Application No. 202210203723.6 filed on Mar. 3, 2022. The disclosures of these applications are hereby incorporated by reference in their entirety.

BACKGROUND

When Dynamic Random Access Memory (DRAM) performs a read operation, the word line (WL) is activated firstly, the data in the corresponding memory subcircuit (selected by the WL and the bit line (BL)) is transmitted to the local data line LIO through the BL, the column decoding circuit Ydec is driven through the column selection signal YS to transmit the data in the local data line LIO to the global data line YIO, the data is transmitted to the read-write control circuit RWCB through the global data line YIO, and the data is transmitted to the transmission bus DQ through the global data line YIO after the data is grabbed by the read-write control circuit RWCB, thereby completing the data readout.

Due to the position setting relationship between the column decoding circuit and the read-write control circuit and the high RC load of the column selection signal YS, the time consumptions that the column selection signal YS actually effects different storage areas are different. For the case where the transmission directions of the column selection signal YS and the global data line YIO in different storage areas are opposite, the read-write control circuit RWCB needs to be activated after the data transmission on the global data line YIO is completed. When performing continuous read operations, the transmission time of the global data line YIO in part storage areas is long, but the column selection signal YS is activated early. The transmission time of global data line YIO in part storage areas is short, but the column selection signal YS is activated late, which seriously limits the improvement of the Cas to Cas delay (tCCD) of the DRAM.

For the case where the transmission directions of the column selection signal YS and the global data line YIO in different storage areas are the same, when performing the continuous read operations, the transmission time of the global data line YIO in part storage areas is long, but the corresponding column selection signal YS is activated late. However, the selection signal YS has a high RC load, which will still lead to the time consumptions that the column selection signal YS actually effects different storage areas are different. If the time for the RWCB to grab the global data line YIO is fixed, the latest effecting time of the column selection signal YS is used to set the time for the RWCB to grab signal, which will waste the time for the global data line YIO to perform equalization adjustment, and will also limit the tCCD of the DRAM, thereby affecting the read and write speed of DRAM.

SUMMARY

The present disclosure relates to, but is not limited to, a circuit for reading out data, a method for reading out data and a memory.

The embodiments of the present disclosure provide a circuit for reading out data, which is applicable for a memory. The memory includes a read-write control circuit, a column decoding circuit, and a plurality of storage areas. The circuit includes a delay generation circuit. The delay generation circuit is configured to generate a sub-grab signal for each of the storage areas based on an initial grab signal and data transmission delay of each of the storage areas, and generate a grab enable signal based on all sub-grab signals. A data transmission delay corresponding to a storage area close to a column decoding circuit is less than a data transmission delay corresponding to a storage area far from the column decoding circuit. A time interval between a time when the read-write control circuit receives data transmitted from a global data line by each of the storage areas and a time when the read-write control circuit receives the sub-grab signal corresponding to the storage area satisfies a preset range. The read-write control circuit is configured to read out data on the global data line to a data bus based on the grab enable signal. The global data line is configured to read out data of the storage areas through the column decoding circuit based on a column selection signal.

The embodiments of the present disclosure also provide a method for reading out data, which is applicable for the above circuit for reading out data. The method includes the following operations. Data in a memory subcircuit is read out to the global data line based on a column selection signal. An initial grab signal is provided. A sub-grab signal gxEn for each of the storage areas is generated based on an initial grab signal gEn and data transmission delay of each of the storage areas to cause that a time interval between a time when the read-write control circuit receives data transmitted from a global data line by each of the storage areas and a time when the read-write control circuit receives the sub-grab signal corresponding to the storage area satisfies a preset range. A data transmission delay corresponding to a storage area close to a column decoding circuit is less than a data transmission delay corresponding to a storage area far from the column decoding circuit. A grab enable signal is generated based on all sub-grab signals. Data on the global data line is read out to a data bus based on the grab enable signal.

The embodiments of the present disclosure also provide a memory. The memory includes a read-write control circuit, a plurality of storage areas and a column decoding circuit. Each of the storage areas is connected to a global data line YIO, and reads out data stored in a memory subcircuit to the global data line YIO based on a column selection signal YS through the column decoding circuit. Data on the global data line is read out by using the circuit for reading out data provided in the above embodiment.

BRIEF DESCRIPTION OF THE DRAWINGS

One or more embodiments are described exemplarily by the drawings in the corresponding accompanying drawings, and these exemplary descriptions do not constitute limitations on the embodiments, unless otherwise stated, the drawings in the accompanying drawings do not constitute a scale limitation. In order to more clearly illustrate the technical solutions in the embodiments of the present disclosure or in the traditional technology, the accompanying drawings required in the embodiments will be briefly introduced below. Obviously, the drawings in the following description are only some embodiments of the present disclosure, for those skilled in the art, other drawings can also be obtained according to these drawings without creative efforts.

DETAILED DESCRIPTION

Due to the position setting relationship between the column decoding circuit and the read-write control circuit, for the case where the transmission directions of the column selection signal YS and the global data line YIO in different storage areas are opposite, the read-write control circuit RWCB needs to be activated after the data transmission on the global data line YIO is completed. When performing continuous read operations, the transmission time of the global data line YIO in part storage areas is long, but the column selection signal YS is activated earliest. The transmission time of global data line YIO in part storage areas is short, but the column selection signal YS is activated latest, which seriously limits the improvement of DRAM's tCCD (Cas to Cas delay, the time interval between CAS command and CAS command, CAS refers to Column Address Strobe).

For the case where the transmission directions of the column selection signal YS and the global data line YIO in different storage areas are the same, when performing the continuous read operations, the transmission time of the global data line YIO in part storage areas is long, but the corresponding column selection signal YS is activated late. However, the selection signal YS has a high RC load, which will still lead to the time consumptions that the column selection signal YS actually effects different storage areas are different. If the time for the RWCB to grab the global data line YIO is fixed, the latest effecting time of the column selection signal YS is used to set the time for the RWCB to grab signal, which will waste the time for the global data line YIO to perform equalization adjustment, and will also limit the tCCD of the DRAM, thereby affecting the read and write speed of DRAM. The embodiments of the present disclosure provide a circuit for reading out data to unify the time intervals between the time when the read-write control circuit RWCB receives data transmitted from different storage areas by the global data line YIO and the time when the read-write control circuit RWCB receives the sub-grab signal corresponding to the storage area, thereby optimizing the tCCD of the DRAM.

Figure 1:
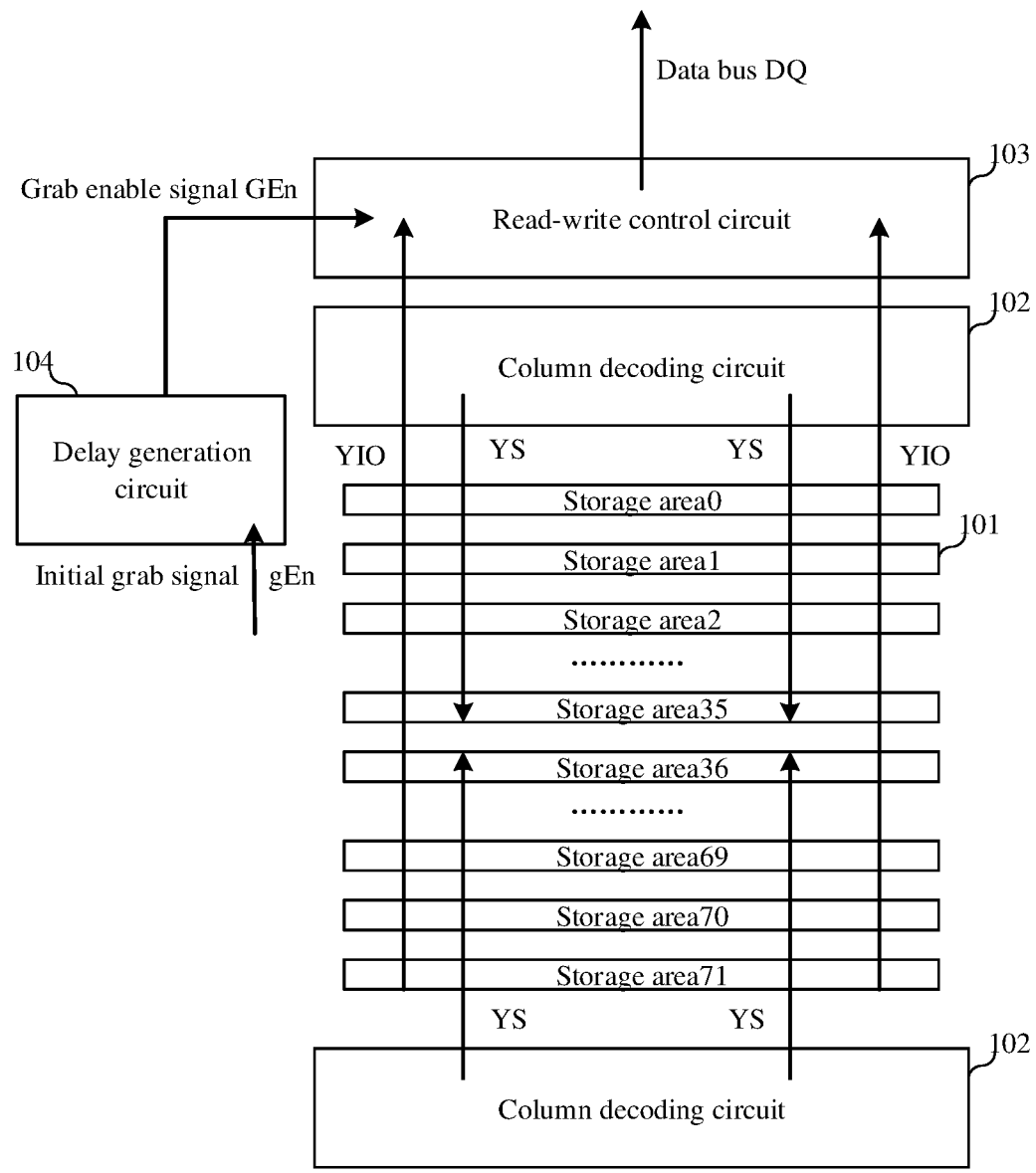
FIG. 1 is a partial structural schematic diagram of a DRAM performing data storage according to some embodiments of the present disclosure.

Referring to FIG. 1, for settings of part DRAM, since the capacitance of the BL cannot be reduced through the process, it is necessary to drive the column selection signal YS at both ends to improve the read-write rate of the DRAM. At this time, the transmission directions of the column selection signal YS and the global data line YIO in part storage areas are the same. For example, taking the data bank of DRAM being divided into 72 storage areas as an example, the transmission directions of the column selection signal YS and the global data line YIO in the storage area 36 to the storage area 71 are the same. The tCCD of this part of the storage areas is easy to control. The transmission directions of the column selection signal YS and the global data line YIO in part storage areas are opposite, such as storage area 0 to storage area 35. The above problems also exist.

Referring to the structure shown in FIG. 1, The tCCD optimization of the storage areas in which the transmission directions of the column selection signal YS and the global data line YIO are opposite is described in detail based on the storage area 0 to the storage area 35 in the present embodiment, which does not constitute a limitation of the present embodiment, but also applies to the storage area 36 to the storage area 71. In other embodiments, if the DRAM is not set to a manner of driving the column selection signal YS at both ends, the features mentioned in the present embodiment are still applicable for the storage areas of DRAM.

It can be understood by those skilled in the art that, in the various embodiments of the present disclosure, many technical details are provided for the reader to better understand the present disclosure. However, even without these technical details and various changes and modifications based on the following embodiments, the technical solutions claimed in the present disclosure can be implemented. The following divisions of the various embodiments are for the convenience of description, and should not constitute any limitation on the specific implementation of the present disclosure. The various embodiments may be combined with each other and referred to each other under the premise of not contradicting each other.

Figure 2:
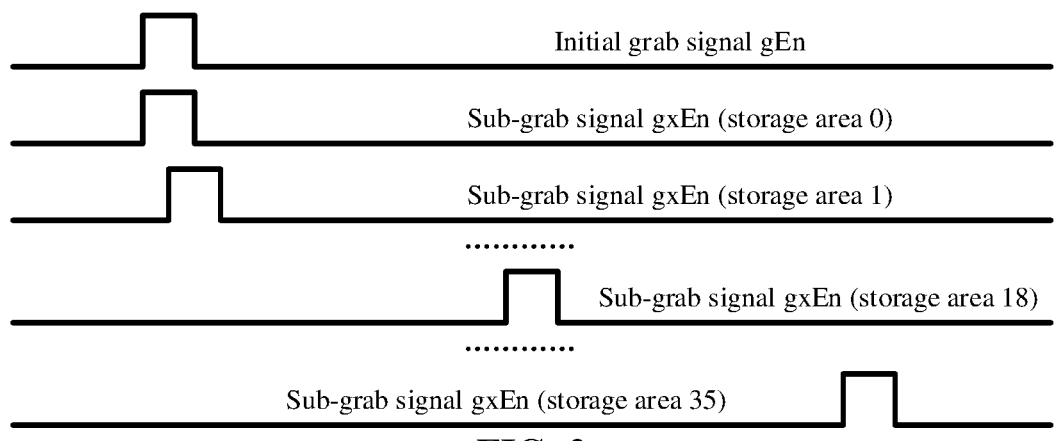
FIG. 2 is a schematic time sequence diagram of an initial grab signal and the sub-grab signals provided by some embodiments of the present disclosure.
Figure 3:
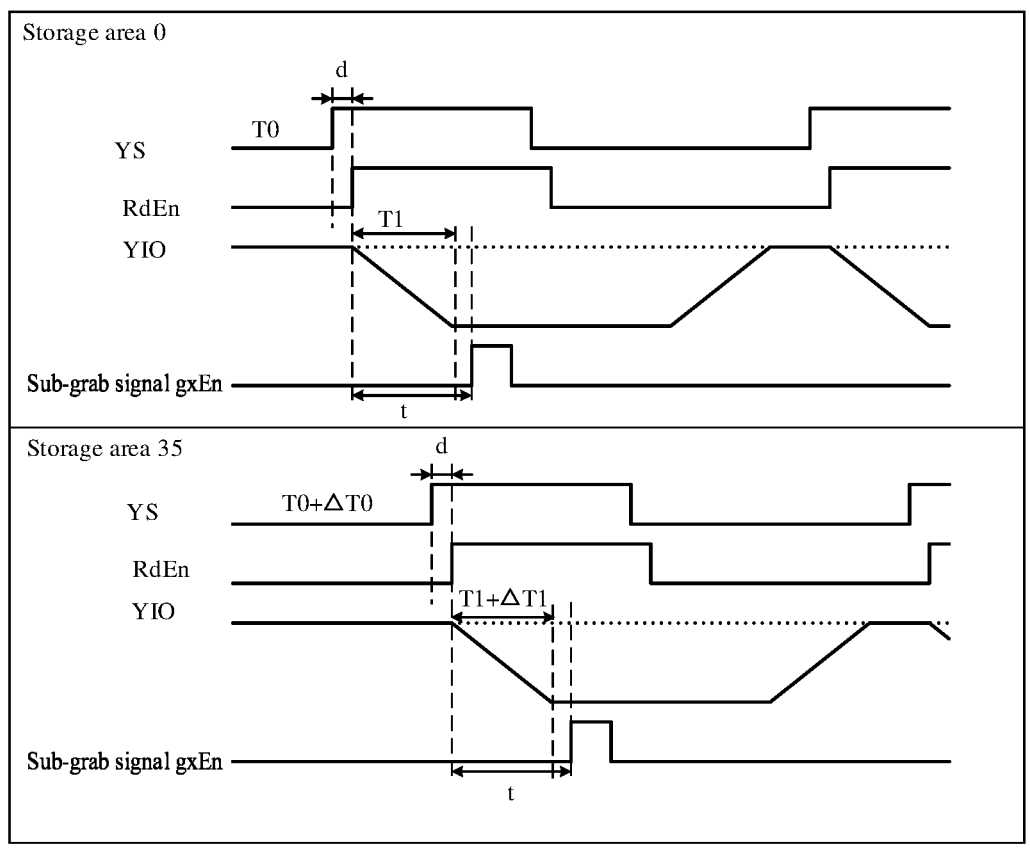
FIG. 3 is a signal readout sequence, for different storage areas, of a circuit for reading out data provided by some embodiments of the present disclosure.
Figure 4:
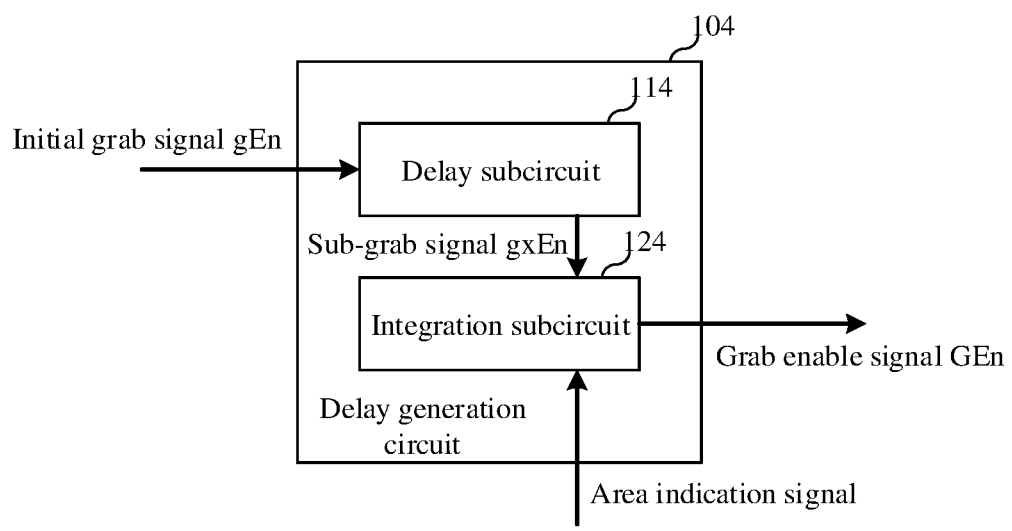
FIG. 4 is a schematic structural diagram of a delay generation circuit provided by some embodiments of the present disclosure.
Figure 5:
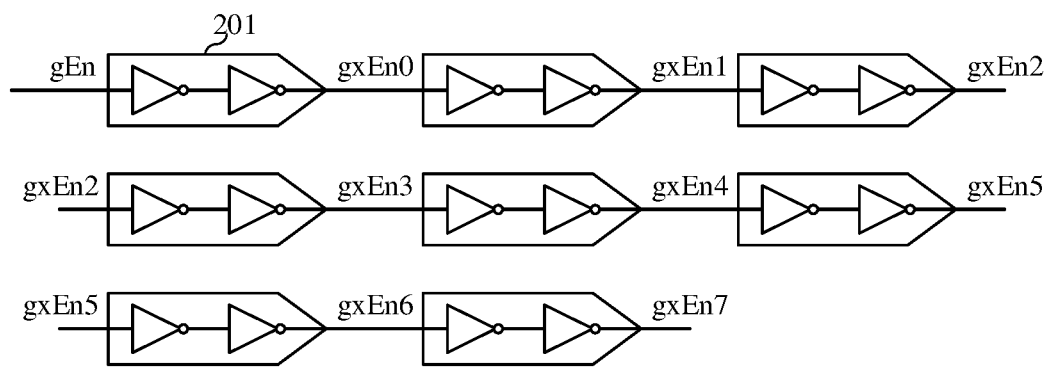
FIG. 5 is a schematic structural diagram of a delay subcircuit provided by some embodiments of the present disclosure.
Figure 6:
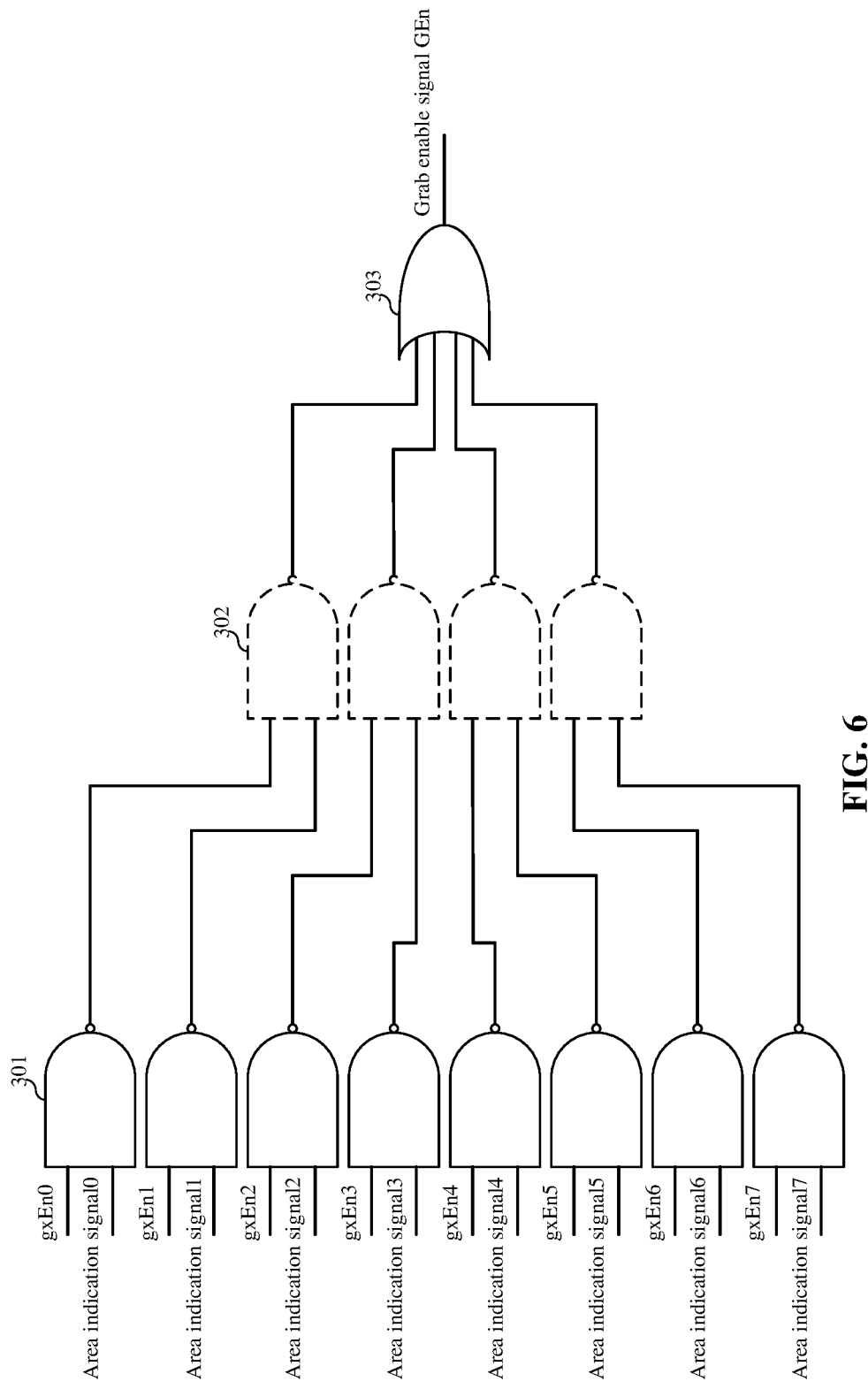
FIG. 6 is a schematic structural diagram of an integration subcircuit provided by some embodiments of the present disclosure.
Figure 7:
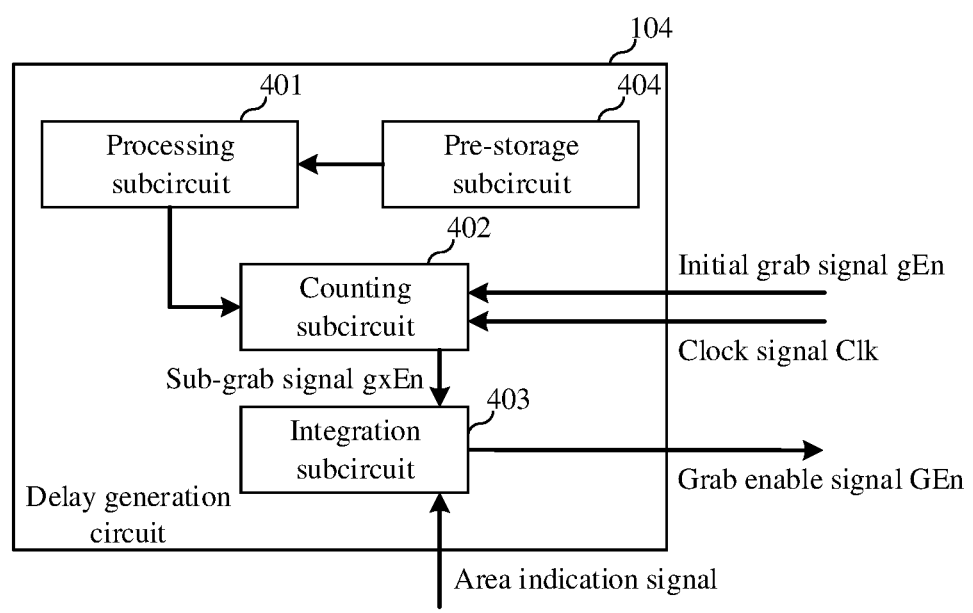
FIG. 7 is a schematic structural diagram of a delay generation circuit provided by some embodiments of the present disclosure.

FIG. 1 is a partial structural schematic diagram of a DRAM performing data storage according to some embodiments of the present disclosure. FIG. 2 is a schematic time sequence diagram of an initial grab signal and the sub-grab signals provided by some embodiments of the present disclosure. FIG. 3 is a signal readout sequence, for different storage areas, of a circuit for reading out data provided by some embodiments of the present disclosure. FIG. 4 and FIG. 7 are schematic structural diagrams of a delay generation circuit provided by some embodiments of the present disclosure. FIG. 5 is a schematic structural diagram of the delay subcircuit provided by some embodiments of the present disclosure. FIG. 6 is a schematic structural diagram of an integration subcircuit provided by some embodiments of the present disclosure. The following is a further detailed description of the circuit for reading out data provided by some embodiments of the present disclosure in conjunction with the accompanying drawings.

Referring to FIG. 1, a circuit for reading out data is applicable for to a memory. The circuit includes column decoding circuits 102 and a plurality of storage areas 101. The circuit further includes a delay generation circuit.

The delay generation circuit 104 is configured to generate a sub-grab signal gxEn for each of the storage areas 101 based on an initial grab signal gEn and data transmission delay of each of the storage areas 101, and generate a grab enable signal GEn based on all sub-grab signals gxEn.

A data transmission delay corresponding to a storage area close to a column decoding circuit 102 is less than a data transmission delay corresponding to a storage area far from the column decoding circuit 102. That is, a data transmission delay corresponding to a storage area close to the read-write control circuit 103 is less than a data transmission delay corresponding to a storage area far from the read-write control circuit 103.

Specifically, in the circuit shown in FIG. 1, for the storage areas 0-35, the distance between the storage area 35 and the read-write control circuit 103 is relatively far, and the time for the data to be transmitted from the storage area 35 to the read-write control circuit 103 through the global data line YIO is long, that is, the data transmission delay of the storage area 35 is great. The distance between the storage area 0 and the read-write control circuit 103 is relatively close, and the time for the data to be transmitted from the storage area 0 to the read-write control circuit 103 through the global data line YIO is short, that is, the data transmission delay of the storage area 0 is small. For the storage areas 36-71, the distance between the storage area 71 and the read-write control circuit 103 is relatively far, and the time for the data to be transmitted from the storage area 71 to the read-write control circuit 103 through the global data line YIO is long, that is, the data transmission delay of the storage area 71 is great. The distance between the storage area 36 and the read-write control circuit 103 is relatively close, and the time for the data to be transmitted from the storage area 36 to the read-write control circuit 103 through the global data line YIO is short, that is, the data transmission delay of the storage area 36 is small.

A time interval between a time when the read-write control circuit RWCB receives data transmitted from each of the storage areas 101 by a global data line YIO and a time when the read-write control circuit RWCB receives the sub-grab signal gxEn corresponding to the storage area 101 satisfies a preset range.

In some embodiments, a value of the data transmission delay is greater than or equal to a transmission delay of the data on the global data line YIO between the storage area 101 and the read-write control circuit 103.

Further, in some embodiments, the value of the data transmission delay is equal to a transmission delay of the data on the global data line YIO between the storage area 101 and the read-write control circuit 103.

For the storage areas 0 to 35, it can be seen from the figure that for the column selection signal YS sent by the column decoding circuit 102, the time when the storage area far from the column decoding circuit 102 receives the column selection signal YS is later than the time when the storage area close to the column decoding circuit 102 receives the column selection signal YS. Referring to FIG. 1, it is assumed that the column selection signal YS is provided at time 0, the time when the storage area 0 receives the column selection signal YS is T0, and the time for the storage areas 1 to 35 receiving the column selection signal YS is delayed to be T0+ΔT0 (ΔT0 is different for different storage areas 101).

As can be seen from the above, the data transmission delay corresponding to the storage area close to the column decoding circuit 102 is less than the data transmission delay corresponding to the storage area far away from the column decoding circuit 102. Referring to FIG. 1, it is assumed that the delay of the data in the storage area 0 to be transmitted to the read-write control circuit 103 through the global data line is T1, and the delay of the data in the storage areas 1 to 35 to be transmitted to the read-write control circuit 103 through the global data line is T1+ΔT1 (ΔT1 is different for different storage areas 101).

In an ideal situation (the delay of the column selection signal YS and the data transmission delay of the global data line are not existed), the time for the data of the storage area 101 to be transmitted to the read-write control circuit 103 is T0+T1. However, in an actual situation, the time for the data of the storage area 101 to be transmitted to the read-write control circuit 103 is T0+ΔT0+T1+ΔT1. The data grab time for each of storage areas is adjusted by generating the sub-grab signal gxEn of each of storage areas 101 according to the initial grab signal gEn. The data is grabbed by the read-write control circuit 103 at different times to unify the time intervals between the time when the read-write control circuit 103 receives data transmitted from different storage areas 101 by the global data line YIO and the time when the read-write control circuit 103 receives the sub-grab signal gxEn corresponding to the storage area, such that the time interval between a time when the read-write control circuit 103 receives data transmitted from each of the storage areas 101 by a global data line YIO and a time when the read-write control circuit receives the sub-grab signal gxEn corresponding to the storage area 101 satisfies a preset range.

Specifically, referring to FIG. 2 and FIG. 3, for a storage area 101 close to the column decoding circuit 102, such as storage area 0, the column selection signal YS can be received faster, that is, T0+ΔT0 is smaller. For this storage area 101, after the time d of transmitting the signal by the local input and output circuit, the read operation enable signal RdEn is generated. Under the effect of the read operation enable signal RdEn, the data transmission of the global data line YIO can be performed faster, that is, T1+ΔT1 is smaller. At this time, the time for the read-write control circuit 103 to receive the read out data transmitted from this storage area 101 is earlier, that is, T0+ΔT0+T1+ΔT1 is small. The read-write control circuit 103 is controlled to grab the data in advance through the sub grab signal gxEn, so that the time interval t satisfies the preset range.

Continuing to refer to FIG. 2 and FIG. 3, for a storage area 101 far from the column decoding circuit 102, such as the storage area 35, the column selection signal YS needs to be received slowly, that is, T0+ΔT0 is greater. For this storage area 101, after the time d of transmitting the signal by the local input and output circuit, the read operation enable signal RdEn is generated. Under the effect of the read operation enable signal RdEn, the data transmission of the global data line YIO needs to be performed slowly, that is, T1+ΔT1 is greater. The time for the read-write control circuit 103 to receive the read out data transmitted from this storage area 101 is later, that is, T0+ΔT0+T1+ΔT1 is great. The read-write control circuit 103 is controlled to delay grabbing data through the sub grab signal gxEn, so that the time interval t satisfies the preset range.

For the storage areas 36 to 71, based on the above discussion assumptions, the delay time for the storage areas 36 to 71 to receive the column selection signal YS is T0+ΔT0 (ΔT0 is different for different storage areas 101). The delay for the data in the areas 36 to 71 to be transmitted to the read-write control circuit 103 through the global data line is T1+ΔT1 (ΔT1 is different for different storage areas 101).

For a storage area 101 close to the column decoding circuit 102, such as the storage area 71, the column selection signal YS can be received faster, that is, T0+ΔT0 is smaller, and for this storage area 101, the data transmission of the global data line YIO needs to be performed slowly, that is, T1+ΔT1 is greater. For a storage area 101 far away from the column decoding circuit 102, such as the storage area 36, the column selection signal YS needs to be received slowly, that is, T0+ΔT0 is greater, and for this storage area 101, the data transmission of the global data line YIO can be performed faster, that is, T1+ΔT1 is smaller. Due to the high RC load of the column selection signal YS, the time T0+ΔT0+T1+ΔT1 for the read-write control circuit 103 to receive the readout data transmitted from different storage areas 101 will still be different. The greater T0+ΔT0 is, the greater T0+ΔT0+T1+ΔT1 is. That is, for the storage area 101 close to the column decoding circuit 102, it is necessary to control the read-write control circuit 103 to grab data in advance through the sub grab signal gxEn, so that the time interval t satisfies the preset range, and for the storage area 101 far from the column decoding circuit 102, it is necessary to control the read-write control circuit 103 to delay grabbing data through the sub-grab signal gxEn, so that the time interval t satisfies the preset range.

Each of sub-grab signal gxEn is used to configure the corresponding storage area 101 to complete the readout of data. If the data is continuously read out, the effective level of the corresponding sub-grab signal gxEn is integrated on the same signal to generate the grab enable signal GEn according to the storage area needed to be read out. The grab enable signal GEn is used to instruct the corresponding storage area to complete continuous data readout. The read-write control circuit 103 is configured to read out data of the global data line YIO to the data bus DQ based on the grab enable signal GEn.

The global data line YIO is configured to read out data of the storage areas 101 through the column decoding circuit 102 based on the column selection signal YS.

In some embodiments, in order to further optimize the tCCD of the DRAM, a time interval between a time when the read-write control circuit 103 receives data transmitted from each of the storage areas 101 by a global data line YIO and a time when the read-write control circuit 103 receives the sub-grab signal gxEn corresponding to the storage area 101.

In some embodiments, referring to FIG. 4, the delay generation circuit 104 includes a delay subcircuit and an integration subcircuit.

The delay subcircuit 114 is configured to generate the sub-grab signal gxEn corresponding to each of the storage areas 101.

The integration subcircuit 124 is configured to generate the grab enable signal GEn based on the sub-grab signal gxEn corresponding to a storage area 101 to which a word line in an active state belongs.

In an example, the delay subcircuit 104 includes a plurality of delay subunits 201, and the plurality of delay subunits 201 are connected in series. Among the plurality of delay subunits 201 connected in series, an input end of the first stage delay subunit 201 is used for receiving the initial grab signal gEn, a connection line between two adjacent delay subunits 201 and an output end of last stage delay subunit 201 are used for outputting sub grab signals corresponding to different storage areas. Different sub-grab signals gxEn have different data transmission delays. The delay subunit may be a secondary delay sub-circuit or a delay component which is a hardware element having delay function.

Referring to FIG. 5, the first stage delay subunit 201 is used for receiving the initial grab signal gEn, and generating the sub-grab signal gxEn0. The second stage delay subunit 201 is used for receiving the sub-grab signal gxEn0, and generating the sub-grab signal gxEn1. The third stage delay subunit 201 is used for receiving the sub-grab signal gxEn1, and generating the sub-grab signal gxEn2. The fourth stage delay subunit 201 is used for receiving the sub-grab signal gxEn2, and generating the sub-grab signal gxEn3. The fifth stage delay subunit 201 is used for receiving the sub-grab signal gxEn3, and generating the sub-grab signal gxEn4. The sixth stage delay subunit 201 is used for receiving the sub-grab signal gxEn4, and generating the sub-grab signal gxEn5. The seventh stage delay subunit 201 is used for receiving the sub-grab signal gxEn5, and generating the sub-grab signal gxEn6. The eighth stage delay subunit 201 is used for receiving the sub-grab signal gxEn6, and generating the sub-grab signal gxEn7.

For the circuit shown in FIG. 1, each sub-grab signal gxEn is used for data readout of four storage areas 101. That is, the sub-grab signal gxEn0 is used for data storage of the storage areas 0 to 3, the sub-grab signal gxEn1 is used for data storage of storage areas 4 to 7, the sub-grab signal gxEn2 is used for data storage of storage areas 8 to 11, the sub-grab signal gxEn3 is used for data storage of storage areas 12 to 15 . . . . It should be noted that, in other embodiments, each of sub-grab signals may be used for data readout of any number of storage areas. If the number of applied storage areas is smaller, the data readout control over the storage area is more accurate. if the number of applied storage areas is greater, the consumption when the memory reads out data may be saved.

In some embodiments, each delay subunit 201 is provided with an even number of inverters, and parts of the delay subunits 201 have different numbers of inverters. That is, different delay subunits are used for generating different data delay. In other embodiments, each delay subunit 201 is provided with an even number of inverters, and part of the delay subunits 201 have the same number of inverters. That is, each of delay subunits is used for generating the same data delay.

In some embodiments, referring to FIG. 6, the integration subcircuit 124 includes a plurality of primary NAND gates.

Each of the primary NAND gates 301 corresponds to at least one storage area. One input end of the primary NAND gate 301 is used for receiving an area indication signal corresponding to the storage area 101, and another input end of the primary NAND gate is used for receiving the sub-grab signal corresponding to the storage area.

The area indication signal is used for representing the storage area 101 to which the word line in the active state belongs.

The output ends of the plurality of primary NAND gates 301 are connected to a same output OR gate 303, and the output OR gate 303 is used for outputting the grab enable signal GEn.

The grab enable signal GEn is acquired by integrating the effective levels in the plurality of effective sub-grab signals gxEn to the same effective level, so as to drive the selected multiple storage areas 101 based on the grab enable signal GEn, thereby implementing the continuous reading and writing for different storage areas 10.

It should be noted that, eight primary NAND gates 301 are used as an example for detailed description in FIG. 6. That is, four storage areas 101 share one primary NAND gate 301, which does not constitute a limitation on the embodiments of the present disclosure. In other embodiments, the specific settings may be one primary NAND gate 301 corresponding to any number of storage areas 10.

In some embodiments, the integration subcircuit 124 further includes a plurality of secondary NAND gates 302.

The number of secondary NAND gates 302 is less than the number of primary NAND gates 301, and each of the secondary NAND gates 302 is connected to at least two primary NAND gates 301.

The output ends of the plurality of primary NAND gates are connected to the same output OR gate 303, and the output OR gate 303 are used for outputting the grab enable signal Gen, which includes: the output ends of the plurality of secondary NAND gates 302 are connected to the same output OR gate 303.

The AND operation is performed on the sub-grab signals gxEn of the plurality of primary NAND gates through the secondary NAND gates to acquire a new enable signal to drive the plurality of storage areas at the same time. In some embodiments, it may also be directly set that the sub-grab signals gxEn drive the same numbers of storage areas correspondingly.

In some embodiments, the delay subcircuit 114 includes delay transmission wires, the delay transmission wires connect the input ends of the plurality of primary NAND gates 301, and the delay subcircuit 114 further includes a signal end for receiving the initial grab signal gEn, and the distance between the signal end and a connection point of the input ends of a primary NAND gate 301 is positively correlated with the data transmission delay corresponding to the primary NAND gate 301.

In some embodiments, referring to FIG. 7, the delay generation circuit 104 includes a processing subcircuit 401, a counting subcircuit 402 and an integration subcircuit 403.

The processing subcircuit 401 is configured to acquire, according to an address of an activated word line, a storage area 101 to which the address of the activated word line belongs, and acquire, based on a position of the storage area 101, a preset value corresponding to the storage area 101.

The counting subcircuit 402 is connected to the processing subcircuit 401, and is configured to receive the initial grab signal gEn, perform counting based on a clock signal Clk, and output the sub-grab signal gxEn corresponding to the storage area when a count value is equal to the preset value.

The integration subcircuit 403 is configured to generate the grab enable signal GEn based on a sub-grab signal gxEn corresponding to a storage area to which a word line in an active state belongs.

Further, in some examples, the delay generation circuit 104 further includes a pre-storage subcircuit 404 connected to the processing subcircuit 401. The pre-storage subcircuit 404 is configured to pre-store a preset value corresponding to each of the storage areas 101.

It should be noted that, in the some embodiments of the present disclosure, the clock signal Clk used by the counting subcircuit 402 is an internal clock signal of the memory. In other embodiments, the clock signal used by the counting subcircuit may be set to be acquired according to an external clock signal.

In some embodiments of the present disclosure, the data grab time for each of storage areas is adjusted by generating the sub-grab signal gxEn of each of storage areas 101 according to the initial grab signal gEn. The data is grabbed by the read-write control circuit 103 at different times to unify the time intervals between the time when the read-write control circuit 103 receives data transmitted from different storage areas 101 by the global data line YIO and the time when the read-write control circuit 103 receives the sub-grab signal gxEn corresponding to the storage area, thereby optimizing the tCCD of the DRAM.

All subcircuits involved in the embodiments are logical subcircuits. In practical applications, a logical subcircuit may be a physical subcircuit, a part of a physical subcircuit, or a combination of multiple physical subcircuits. In addition, in order to highlight the innovative part of the present disclosure, the present embodiment does not introduce subcircuits that are not closely related to solving the technical problems raised by the present disclosure, but this does not mean that there are no other subcircuits in the present embodiment.

It should be noted that, the features disclosed in the circuit for reading out data provided by the above embodiments may be combined arbitrarily without conflict, and a new embodiment of circuit for reading out data may be obtained.

Some embodiments of the present disclosure provide a method for reading out data, so as to unify the time intervals between the time when the read-write control circuit receives data transmitted from different storage areas by the global data line and the time when the read-write control circuit receives the sub-grab signal corresponding to the storage area, thereby optimizing the tCCD of the DRAM.

Figure 8:
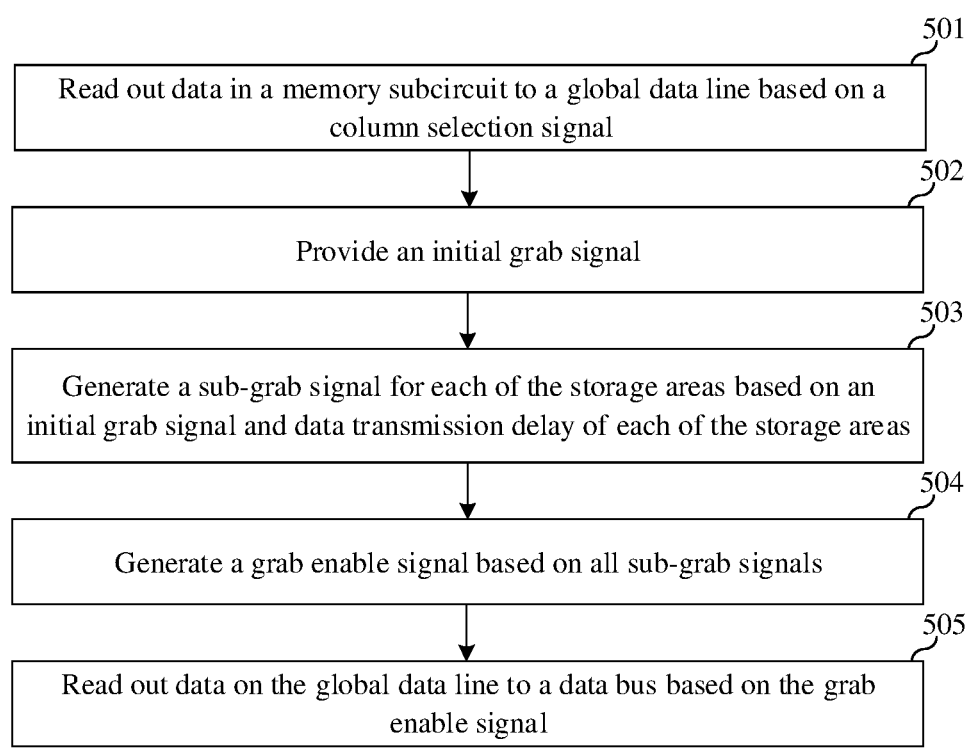
FIG. 8 is a schematic flowchart of a method for reading out data provided by some embodiments of the present disclosure.

FIG. 8 is a schematic flowchart of the method for reading out data provided by some embodiments of the present disclosure. The method for reading out data provided by some embodiments of the present disclosure is further described in detail below with reference to the accompanying drawings.

Referring to FIG. 8, the method for reading out data includes the following steps.

In step 501, data in a memory subcircuit is read out to a global data line based on a column selection signal.

In step 502, an initial grab signal is provided.

In step 503, a sub-grab signal for each of the storage areas is generated based on an initial grab signal and data transmission delay of each of the storage areas.

Specifically, a sub-grab signal for each of the storage areas is generated based on an initial grab signal and a data transmission delay of each of the storage areas, such that a time interval between a time when the read-write control circuit receives data transmitted from each of the storage areas by a global data line and a time when the read-write control circuit receives the sub-grab signal corresponding to the storage area satisfies a preset range.

A data transmission delay corresponding to a storage area close to a column decoding circuit is less than a data transmission delay corresponding to a storage area far from the column decoding circuit.

In some embodiments, a value of the data transmission delay is greater than or equal to a transmission delay of the data transmitting in the global data line YIO between the storage area 101 and the read-write control circuit 103.

Further, in some embodiments, the value of the data transmission delay is equal to a transmission delay of the data transmitting in the global data line YIO between the storage area 101 and the read-write control circuit 103.

In one example, the operation of generating the sub-grab signal corresponding to each of the storage areas based on the initial grab signal and a data transmission delay of the global data line between each of the storage areas and the read-write control circuit includes the following operations. A data transmission delay of the global data line between each of the storage areas and the read-write control circuit is acquired. The sub-grab signal corresponding to each of the storage areas is generated based on the initial grab signal and data transmission delay.

In one example, the operation of generating the sub-grab signal corresponding to each of the storage areas based on the initial grab signal and a data transmission delay of the global data line between each of the storage areas and the read-write control circuit includes the following operations. An address of an activated word line is acquired. A storage area to which the address of the activated word line belongs is acquired. A preset value corresponding to the storage area is acquired based on a position of the storage area. Counting is performed based on the initial grab signal and a clock signal. The sub-grab signal of the storage area corresponding to the preset value is output when a count value is equal to the preset value.

For the storage areas 0 to 35, it can be seen from the figure that for the column selection signal YS sent by the column decoding circuit 102, the time when the storage area far from the column decoding circuit 102 receives the column selection signal YS is later than the time when the storage area close to the column decoding circuit 102 receives the column selection signal YS. Referring to FIG. 1, it is assumed that the column selection signal YS is provided at time 0, the time when the storage area 0 receives the column selection signal YS is T0, and the time for the storage areas 1 to 35 receiving the column selection signal YS is delayed to be T0+ΔT0 (ΔT0 is different for different storage areas 101).

As can be seen from the above, the data transmission delay corresponding to the storage area close to the column decoding circuit 102 is less than the data transmission delay corresponding to the storage area far away from the column decoding circuit 102. Referring to FIG. 1, it is assumed that the delay of the data in the storage area 0 to be transmitted to the read-write control circuit 103 through the global data line is T1, and the delay of the data in the storage areas 1 to 35 to be transmitted to the read-write control circuit 103 through the global data line is T1+ΔT1 (ΔT1 is different for different storage areas 101).

In an ideal situation (the delay of the column selection signal YS and the data transmission delay of the global data line are not existed), the time for the data of the storage area 101 to be transmitted to the read-write control circuit 103 is T0+T1. However, in an actual situation, the time for the data of the storage area 101 to be transmitted to the read-write control circuit 103 is T0+ΔT0+T1+ΔT1. The data grab time for each of storage areas is adjusted by generating the sub-grab signal gxEn of each of storage areas 101 according to the initial grab signal gEn. The data is grabbed by the read-write control circuit 103 at different times to unify the time intervals between the time when the read-write control circuit 103 receives data transmitted from different storage areas 101 by the global data line YIO and the time when the read-write control circuit 103 receives the sub-grab signal gxEn corresponding to the storage area, such that the time interval between a time when the read-write control circuit 103 receives data transmitted from each of the storage areas 101 by a global data line YIO and a time when the read-write control circuit receives the sub-grab signal gxEn corresponding to the storage area 101 satisfies a preset range.

Specifically, referring to FIG. 2 and FIG. 3, for a storage area 101 close to the column decoding circuit 102, such as storage area 0, the column selection signal YS can be received faster, that is, T0+ΔT0 is smaller. For this storage area 101, after the time d of transmitting the signal by the local input and output circuit, the read operation enable signal RdEn is generated. Under the effect of the read operation enable signal RdEn, the data transmission of the global data line YIO can be performed faster, that is, T1+ΔT1 is smaller. At this time, the time for the read-write control circuit 103 to receive the read out data transmitted from this storage area 101 is earlier, that is, T0+ΔT0+T1+ΔT1 is small. The read-write control circuit 103 is controlled to grab the data in advance through the sub grab signal gxEn, so that the time interval t satisfies the preset range.

Continuing to refer to FIG. 2 and FIG. 3, for a storage area 101 far from the column decoding circuit 102, such as the storage area 35, the column selection signal YS needs to be received slowly, that is, T0+ΔT0 is greater. For this storage area 101, after the time d transmitting the signal by of the local input and output circuit, the read operation enable signal RdEn is generated. Under the effect of the read operation enable signal RdEn, the data transmission of the global data line YIO needs to be performed slowly, that is, T1+ΔT1 is greater. The time for the read-write control circuit 103 to receive the read out data transmitted from this storage area 101 is later, that is, T0+ΔT0+T1+ΔT1 is great. The read-write control circuit 103 is controlled to delay grabbing data through the sub grab signal gxEn, so that the time interval t satisfies the preset range.

For the storage areas 36 to 71, based on the above discussion assumptions, the delay time for the storage areas 36 to 71 to receive the column selection signal YS is T0+ΔT0 (ΔT0 is different for different storage areas 101). The delay for the data in the areas 36 to 71 to be transmitted to the read-write control circuit 103 through the global data line is T1+ΔT1 (ΔT1 is different for different storage areas 101).

For a storage area 101 close to the column decoding circuit 102, such as the storage area 71, the column selection signal YS can be received faster, that is, T0+ΔT0 is smaller, and for this storage area 101, the data transmission of the global data line YIO needs to be performed slowly, that is, T1+ΔT1 is greater. For a storage area 101 far away from the column decoding circuit 102, such as the storage area 36, the column selection signal YS needs to be received slowly, that is, T0+ΔT0 is greater, and for this storage area 101, the data transmission of the global data line YIO can be performed faster, that is, T1+ΔT1 is smaller. Due to the high RC load of the column selection signal YS, the time T0+ΔT0+T1+ΔT1 for the read-write control circuit 103 to receive the readout data transmitted from different storage areas 101 will still be different. The greater T0+ΔT0 is, the greater T0+ΔT0+T1+ΔT1 is. That is, for the storage area 101 close to the column decoding circuit 102, it is necessary to control the read-write control circuit 103 to grab data in advance through the sub grab signal gxEn, so that the time interval t satisfies the preset range, and for the storage area 101 far from the column decoding circuit 102, it is necessary to control the read-write control circuit 103 to delay grabbing data through the sub-grab signal gxEn, so that the time interval t satisfies the preset range.

Each of sub-grab signal gxEn is used to configure the corresponding storage area 101 to complete the readout of data. If the data is continuously read out, the effective level of the corresponding sub-grab signal gxEn is integrated on the same signal to generate the grab enable signal GEn according to the storage area needed to be read out. The grab enable signal GEn is used to instruct the corresponding storage area to complete continuous data readout.

In step 504, a grab enable signal is generated based on all sub-grab signals.

Specifically, the grab enable signal is generated by integrating an effective level of each of the sub-grab signals on a same signal. Optionally, the grab enable signal is generated by integrating effective levels shared by parts of the sub-grab signals on secondary grab signals and integrating an effective level of each of secondary grab signals on a same signal. Each part of sub-grab signals shares one effective level.

In step 505, data of the global data line is read out to a data bus based on the grab enable signal.

In some embodiments, the sub-grab signal of each of storage areas is generated according to the initial grab signal to control that the to-be-written-in data in each of storage areas is grabbed by the read-write control circuit at different times., such that for different storage areas, the time intervals between the time when data of the global data line is received and the time when the column selection signal is received are unified. For each of storage areas, the time interval between the time when the sub grab signal is received and the time when the column selection signal is received satisfies the preset range, so as to unify, in different storage areas, the time interval between the time when the column selection signal is received and the time when data transmission on the global data line is completed, and optimize the TCCD of DRAM Since the above embodiments correspond to the present embodiment, the embodiment can be implemented in cooperation with the above embodiments. The relevant technical details mentioned in the above embodiments are still valid in the present embodiment, and the technical effects that can be implemented in the above embodiments can also be implemented in the present embodiment, and in order to reduce repetitions, elaborations are omitted herein. Correspondingly, the relevant technical details mentioned in the present embodiment can also be applied to the above embodiments.

Yet some other embodiments of the present disclosure provide a memory. The memory includes a read-write control circuit, a plurality of storage areas and a column decoding circuit. Each of the storage areas is connected to a global data line YIO, and reads out data stored in a memory subcircuit to the global data line YIO based on a column selection signal YS through the column decoding circuit. Data on the global data line is read out by using the circuit for reading out data provided in the above embodiments, so that time intervals between a time when the read-write control circuit RWCB receives data transmitted from different storage areas by a global data line YIO and a time when the read-write control circuit receives the sub-grab signal corresponding to the storage area are unified.

In some embodiments, the memory is a dynamic random access memory (DRAM) chip. The memory of the DRAM chip conforms to the DDR2 memory specification.

In some embodiments, the memory is a DRAM chip. The memory of the DRAM chip conforms to the DDR3 memory specification.

In some embodiments, the memory is a DRAM chip. The memory of the DRAM chip conforms to the DDR4 memory specification.

In some embodiments, the memory is a DRAM chip. The memory of the DRAM chip conforms to the DDR5 memory specification.

Those skilled in the art can understand that the above embodiments are specific embodiments for implementing the present disclosure, and in practical applications, various changes in form and details can be made without departing from the spirit and the scope of the present disclosure.

In the embodiments of the present disclosure, the circuit for reading out data includes a delay generation circuit. The delay generation circuit is configured to generate a sub-grab signal for each of the storage areas based on an initial grab signal and data transmission delay of each of the storage areas, and generate a grab enable signal based on all sub-grab signals. A data transmission delay corresponding to a storage area close to a column decoding circuit is less than a data transmission delay corresponding to a storage area far from the column decoding circuit. A time interval between a time when the read-write control circuit receives data transmitted from each of the storage areas by a global data line and a time when the read-write control circuit receives the sub-grab signal corresponding to the storage area satisfies a preset range. The read-write control circuit is configured to read out data of the global data line to a data bus based on the grab enable signal. The global data line is configured to read out data of the storage areas through the column decoding circuit based on a column selection signal. The data grab time for each of storage areas is adjusted by generating the sub-grab signal of each of storage areas according to the initial grab signal. The data is grabbed by the read-write control circuit at different times to unify the time intervals between the time when the read-write control circuit receives data transmitted from different storage areas by the global data line and the time when the read-write control circuit receives the sub-grab signal corresponding to the storage area, thereby optimizing the tCCD of the DRAM.

What is claimed is:

1. A circuit for reading out data, applicable for a memory, wherein the memory comprises a read-write control circuit, a column decoding circuit and a plurality of storage areas, and the circuit comprises:
   a delay generation circuit, configured to generate a sub-grab signal for each of the storage areas based on an initial grab signal and a data transmission delay time of each of the storage areas, and generate a grab enable signal based on all sub-grab signals,
   wherein the data transmission delay time of the storage area close to the column decoding circuit is less than the data transmission delay time of the storage area far from the column decoding circuit,
   a time interval between a time when the read-write control circuit receives data transmitted from a global data line by each of the storage areas and a time when the read-write control circuit receives the sub-grab signal corresponding to the storage area satisfies a preset range;
   the read-write control circuit is configured to read out data of the global data line to a data bus based on the grab enable signal; and
   the global data line is configured to read out data of the storage areas through the column decoding circuit based on a column selection signal.

2. The circuit for reading out data of claim 1, wherein the delay generation circuit comprises:
   a delay subcircuit, configured to generate the sub-grab signal corresponding to each of the storage areas;
   an integration subcircuit, configured to generate the grab enable signal based on a sub-grab signal corresponding to a storage area to which a word line in an active state belongs.

3. The circuit for reading out data of claim 2, wherein the delay subcircuit comprises a plurality of delay subunits,
   the plurality of delay subunits are connected in series, and among the plurality of delay subunits connected in series, an input end of a first stage delay subunit is used for receiving the initial grab signal, and a connection line between two adjacent delay subunits and an output end of a last stage delay subunit are used for outputting sub-grab signals corresponding to different storage areas, wherein different sub-grab signals have different data transmission delay times.

4. The circuit for reading out data of claim 3, wherein each of the plurality of delay subunits is provided with an even number of inverters, and part of the plurality of delay subunits have different numbers of inverters.

5. The circuit for reading out data of claim 3, wherein each of the plurality of delay subunits is provided with an even number of inverters, and each of the plurality of delay subunits has a same number of inverters.

6. The circuit for reading out data of claim 2, wherein the integration subcircuit comprises:
a plurality of primary NAND gates, wherein each of the primary NAND gates corresponds to one of the storage areas, one input end of the primary NAND gate is used for receiving an area indication signal corresponding to the storage area, and another input end of the primary NAND gate is used for receiving the sub-grab signal corresponding to the storage area;
wherein the area indication signal is used for representing the storage area to which the word line in the active state belongs,
output ends of the plurality of primary NAND gates being connected to a same output OR gate, and the output OR gate being used for outputting the grab enable signal.

7. The circuit for reading out data of claim 6, wherein the delay subcircuit comprises delay transmission wires, the delay transmission wires connect input ends of the plurality of primary NAND gates, the delay subcircuit further comprises a signal end for receiving the initial grab signal, the distance between the signal end and a connection point of the input ends of a primary NAND gate is positively correlated with the data transmission delay time corresponding to the primary NAND gate.

8. The circuit for reading out data of claim 6, wherein the integration subcircuit further comprises:
a plurality of secondary NAND gates, wherein a number of the secondary NAND gates is less than a number of the primary NAND gates, and each of the secondary NAND gates is connected to at least two of the primary NAND gates;
wherein the output ends of the plurality of primary NAND gates being connected to the same output OR gate, and the output OR gate being used for outputting the grab enable signal comprises: the output ends of the plurality of secondary NAND gates being connected to the same output OR gate.

9. The circuit for reading out data of claim 1, wherein the delay generation circuit comprises:
a processing subcircuit, configured to acquire, according to an address of an activated word line, a storage area to which the address of the activated word line belongs, and acquire, based on a position of the storage area, a preset value corresponding to the storage area;
a counting subcircuit, connected to the processing subcircuit, configured to receive the initial grab signal, perform counting based on a clock signal, and output the sub-grab signal corresponding to the storage area when a count value is equal to the preset value; and
an integration subcircuit, configured to generate the grab enable signal based on a sub-grab signal corresponding to a storage area to which a word line in an active state belongs.

10. The circuit for reading out data of claim 9, wherein the delay generation circuit further comprises: a pre-storage subcircuit, wherein the pre-storage subcircuit is connected to the processing subcircuit, and is configured to pre-store a preset value corresponding to each of the storage areas.

11. The circuit for reading out data of claim 9, wherein the clock signal is an internal clock signal of the memory.

12. The circuit for reading out data of claim 1, wherein the time interval between the time when the read-write control circuit receives data of each of the storage areas transmitted from the global data line and the time when the read-write control circuit receives the sub-grab signal corresponding to the storage area is equal.

13. The circuit for reading out data of claim 1, wherein a value of the data transmission delay time is equal to a transmission delay of the data on the global data line between the storage area and the read-write control circuit.

14. A method for reading out data, applicable for a data readout circuit, comprising:
reading out data in a memory subcircuit to a global data line based on a column selection signal;
providing an initial grab signal;
generating a sub-grab signal for each of the storage areas based on an initial grab signal and a data transmission delay time of each of the storage areas to cause that a time interval between a time when the read-write control circuit receives data transmitted from a global data line by each of the storage areas and a time when the read-write control circuit receives the sub-grab signal corresponding to the storage area satisfies a preset range,
wherein the data transmission delay time of the storage area close to a column decoding circuit is less than the data transmission delay time of the storage area far from the column decoding circuit,
generating a grab enable signal based on all sub-grab signals; and
reading out data of the global data line to a data bus based on the grab enable signal.

15. The method for reading out data of claim 14, wherein generating the grab enable signal based on all the sub-grab signals comprises:
generating the grab enable signal by integrating an effective level of each of the sub-grab signals on a same signal; or
generating the grab enable signal by integrating effective levels shared by parts of the sub-grab signals on secondary grab signals and integrating an effective level of each of secondary grab signals on a same signal.

16. The method for reading out data of claim 14, wherein generating the sub-grab signal for each of the storage areas based on the initial grab signal and data transmission delay time of each of the storage areas comprises:
acquiring a data transmission delay time of the global data line between each of the storage areas and the read-write control circuit; and
generating the sub-grab signal corresponding to each of the storage areas based on the initial grab signal and the data transmission delay time.

17. The method for reading out data of claim 14, wherein generating the sub-grab signal for each of the storage areas based on the initial grab signal and the data transmission delay time of each of the storage areas:
acquiring an address of an activated word line;
acquiring a storage area to which the activated word line belongs;
acquiring, based on a position of the storage area, a preset value corresponding to the storage area;

performing counting based on the initial grab signal and a clock signal, and outputting the sub-grab signal of the storage area corresponding to the preset value.

18. The method for reading out data of claim 14, wherein a value of the data transmission delay time is equal to a transmission delay of the data on the global data line between the storage area and the read-write control circuit.

19. A memory, comprising:

a read-write control circuit, a column decoding circuit and a plurality of storage areas;

wherein each of the storage areas is connected to a global data line, and reads out data stored in a memory subcircuit to the global data line based on a column selection signal through the column decoding circuit; and data on the global data line is read out by using a circuit for reading out data comprising:

a delay generation circuit, configured to generate a sub-grab signal for each of the storage areas based on an initial grab signal and the data transmission delay time of each of the storage areas, and generate a grab enable signal based on all sub-grab signals, wherein the data transmission delay time of the storage area close to a column decoding circuit is less than the data transmission delay time of the storage area far from the column decoding circuit, a time interval between a time when the read-write control circuit receives data transmitted from a global data line by each of the storage areas and a time when the read-write control circuit receives the sub-grab signal corresponding to the storage area satisfies a preset range;

the read-write control circuit is configured to read out data of the global data line to a data bus based on the grab enable signal; and the global data line is configured to read out data of the storage areas through the column decoding circuits based on a column selection signal.

20. The memory of claim 19, wherein the delay generation circuit comprises:

a delay subcircuit, configured to generate the sub-grab signal corresponding to each of the storage areas;

an integration subcircuit, configured to generate the grab enable signal based on a sub-grab signal corresponding to a storage area to which a word line in an active state belongs.

* * * * *